United States Patent [19]
Abbas et al.

[11] 3,992,701
[45] Nov. 16, 1976

[54] NON-VOLATILE MEMORY CELL AND ARRAY USING SUBSTRATE CURRENT

[75] Inventors: Shakir A. Abbas, Wappingers Falls; Robert C. Dockerty, Highland, both of N.Y.

[73] Assignee: International Business Machines Corporation, Armonk, N.Y.

[22] Filed: Apr. 10, 1975

[21] Appl. No.: 567,045

[52] U.S. Cl. .......................... 340/173 R; 307/238; 357/23
[51] Int. Cl.² ..................... G11C 11/40; G11C 7/00
[58] Field of Search ............... 340/173 R; 307/238, 307/304; 357/23, 50

[56] References Cited
UNITED STATES PATENTS

| | | | |
|---|---|---|---|
| 3,508,211 | 4/1970 | Wegener | 340/173 R |
| 3,549,911 | 12/1970 | Scott | 307/279 |
| 3,646,527 | 2/1972 | Wada et al. | 340/173 R |
| 3,836,992 | 9/1974 | Abbas et al. | 357/23 |
| 3,846,768 | 11/1974 | Krick | 340/173 R |

OTHER PUBLICATIONS

Ragonese et al., Circuit and System Aspects of Variable Threshold FET Arrays, pp. 134–135, 1970, IEEE International Convention Digest, pp. 23–26, Mar., 1970.
Dill, et al., A New MNOS Charge Storage Effect, Solid–State Electronics, Pergamon Press, 1969, vol. 12, pp. 981–987.
Chiu, Programmable Read–Only Memory Stack Gate FET, IBM Technical Disclosure Bulletin, vol. 14, No. 11, 4/72, p. 3356.
Abbas, Substrate Current–A Device and Process Monitor, reprint from 1974 "IEDM Technical Digest," pp. 404–407.

*Primary Examiner*—Stuart N. Hecker
*Attorney, Agent, or Firm*—Wolmar J. Stoffel

[57] ABSTRACT

A non-volatile read mostly memory cell in a monocrystalline semiconductor body wherein the sensing of the information is achieved by measuring the substrate current. The cell includes spaced source and drain regions, a gate dielectric layer capable of trapping a charge, a substrate contact electrode; a means to induce a trapped charge into the gate dielectric layer, including a means to apply a voltage larger than the threshold voltage to the gate electrode to form an inversion layer, and a means to apply a voltage to the drain electrode causing channel current to flow; a means to remove the trapped charge, including a means to apply a voltage equal to or exceeding the avalanche voltage to the drain to cause avalanching; a means to determine the presence or absence of a charge in the gate dielectric including a means to apply a voltage to the gate which is larger than the threshold voltage and a voltage to the drain that is significantly less than the avalanche voltage, and a means to determine the substrate current.

12 Claims, 9 Drawing Figures

NON-VOLATILE MEMORY CELL AND ARRAY USING SUBSTRATE CURRENT

DESCRIPTION OF THE PRIOR ART

The present invention relates generally to semiconductor memory cells and arrays, more particularly, to a non-volatile memory cell provided with a gate dielectric layer capable of receiving and holding an electric charge.

Semiconductor devices have found wide application as memory elements. Semiconductor devices are attractive for this application because they are fast, relatively inexpensive, and require low power in operation. Very importantly, a large number of device elements can be combined to form a memory array on a single semiconductor body. Conventional memory cells are usually formed of several active semiconductor devices connected in a bistable circuit. This form of cell, though dependable, presents significant engineering and process difficulties due to its complexity. In a bipolar type integrated circuit, an epitaxial layer of one conductivity type is grown, on a substrate of an opposite conductivity type. Within this epitaxial layer are formed circuit elements such as transistors, diodes, resistors, etc. which are electrically isolated from each other by means of an isolation region of the same conductivity type as the substrate. Since this bipolary type integrated circuit is subjected to various diffusion processes, the manufacturing process thereof is a relatively complex one and the proportion of acceptable products is reduced. In addition, this type of storage device has the disadvantage that a considerable area on the surface of the epitaxial layer is occupied by the isolation region, and that it is imposible to satisfy the requirements of more component elements per unit function. Further, with this type cell, the stored information is lost when there is a power interruption.

It was early recognized that ideally a memory cell be formed of a single element. Accordingly, a number of types of single device memory cells were developed. A non-volatile single device memory cell which evolves was a floating gate avalanche injection field effect transistor device. As is well understood, a floating gate avalanche injection field effect transistor device typically comprises an N-doped silicon substrate in which a pair of spaced, heavily doped P-type impurity regions are formed defining source and drain. An oxide layer is placed over the substrate extending between the source and drain in the channel region and constitutes the FET gate dielectric material. The floating gate electrode comprises pyrolytically deposited polycrystalline silicon which is rendered conductive by a heavy P-type impurity concentration preferably made by diffusing simultaneously with the formation of the source and drain. However, such devices were relatively slow, difficult to produce, and in general, limited in the number of write and erase cycles. Such devices are particularly adapted for read mostly memory applications. A more complete discussion of such memory cells is given in U.S. Pat. No. 3,836,992, inventors Abbas et al.

Another one device memory cell which was developed is the metal-nitride-oxide semiconductor (MNOS) type integrated circuit device employing an insulated gate type field effect transistor having a composite gate insulator. For a more detailed description of such memory devices, reference is made to the technical journal, "Proc. of the IEEE", Vol. 58, No. 8, pages 1207–1219. The MNOS type semiconductor device provides a one element memory device and functions in a manner such that by applying a voltage higher than the critical value to the metal electrode of the MNOS structure with respect to the semiconductor substrate, the density of the charge in the gate insulator is changed and the charges are retained for a certain time duration. The charges may be readily removed by applying a voltage of opposite polarity to the metal electrode. The presence or absence of charge is determined by measuring the channel current when a bias is applied to the gate and drain electrodes. These devices require a very thin oxide layer and typically less than 75 Angstroms, for optimum operation. The thin oxide is difficult to fabricate to the required tolerances.

SUMMARY OF THE INVENTION

An object of the present invention is to provide a new non-volatile memory cell with a novel mode of operation.

Another object of this invention is to provide an array of non-volatile memory cells wherein information is retained in the individual cells by the trapping of charge particles in the gate dielectric layer.

According to the present invention, there is provided a non-volatile read mostly memory cell and memory array utilizing the memory cell wherein the cell is comprised of a monocrystalline semiconductor substrate, spaced source and drain regions of an opposite type impurity, a dielectric layer capable of trapping a charge, a gate electrode overlying the region between the source and drain regions, a substrate contact electrode, means to induce a trapped charge into the dielectric layer including a means to apply a voltage significantly larger than the threshold voltage to the gate dielectric to form an inversion layer, and a second means to apply a voltage less than the avalanche voltage to reverse bias the drain and cause channel current to flow and cause charge injection, a means to remove the trapped charge from the gate dielectric including a means to apply an avalanche voltage to the drain to cause avalanching, a means to determine the presence or absence of a charge in the gate dielectric including a means to apply a voltage to the drain that is significantly less than the avalanche voltage, a means to apply a voltage slightly in excess of the threshold voltage but less than the voltage applied by said means to induce a trapped charge to thereby cause channel and substrate current to flow, and means to determine the substrate current.

BRIEF DESCRIPTION OF THE DRAWINGS

The invention will be described in detail in conjunction with the accompanying drawings in connection with several preferred embodiments in order to facilitate the understanding of the objects and features of the present invention.

DESCRIPTION OF THE PREFERRED EMBODIMENTS

Figure 1:
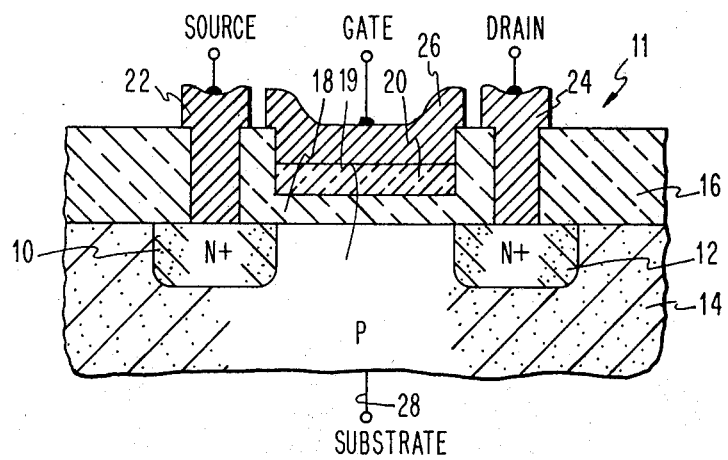
FIG. 1 is an elevational view in broken section of a preferred specific embodiment of a memory cell of the invention.
Figure 3:
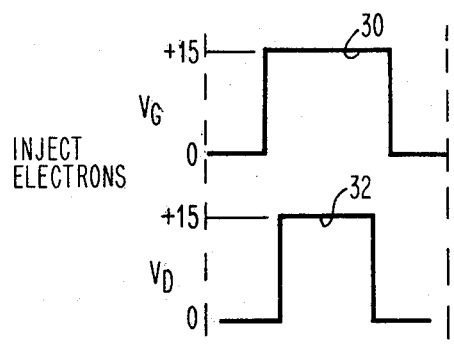
FIG. 3 is a pulse diagram applied to the elements of the cell during a write operation.

Referring now to the drawings, FIG. 1 depicts an elevational view of a preferred specific embodiment 11 of the memory cell of the invention. Source 10 and drain region 12 of a first type impurity are formed in a monocrystalline semiconductor substrate 14 of an opposite type impurity. Preferably, the source and drain regions are formed with an N-type impurity and the substrate 14 has a P-type background impurity with a resistivity on the order of 2Ω-cm. Source and drain regions 10 and 12 can be formed by any suitable operation as for example ion implantation, diffusion, or the like. The surface of body 14 is covered by a suitable dielectric layer 16 preferably having a greater thickness in the field regions than over the channel region. Over the channel region 19 between source and drain regions there is provided a dielectric gate layer that is capable of holding a charge. A typical dielectric layer having this capability is a composite layer of dissimilar materials, as for example a composite layer having a lower layer 18 of $SiO_2$ and an overlying layer 20 of $Si_3N_4$. Layers 18 and 20 can have any suitable thickness, typically each having a thickness in the range of 100 to 1000 Angstroms. More preferably, the layers 18 and 20 will each have a thickness in the range of 150 to 500 Angstroms. As will be explained in more detail, the interface between the layers 18 and 20 will provide a region capable of trapping charges, i.e. electrons or holes. Alternately, various combinations of layers can be used in the composite gate dielectric layer as for example the combination of an $SiO_2$ with an overlying $Al_2O_3$ layer or an underlying $SiO_2$ with an overlying $SiO_xN_y$ layer. Source electrode 22, drain electrode 24 and gate electrode 26 can be fabricated by evaporation and photolithographic and masking techniques as is well known in the art. A substrate electrode 28 can be provided on the bottom side of the device or on a suitable location on the top surface of the device. Information is stored in the memory cell 11 of the invention by injection of charges into the gate dielectric layer where they will be retained at the interface of the layer and where they will influence the operation of the device. In FIG. 3 there is depicted the voltage pulses which are applied to the gate electrode 26 and drain electrode 24 in order to inject charges. In the illustrated embodiment, the source and drain regions are formed of an N-type impurity and the substrate provided with a P-type background impurity. Under these conditions, electrons are injected into the gate dielectric layer. Electrons are injected when a voltage $V_G$ is applied to the gate electrode 26 as indicated by pulse profile 30. The voltage applied to the gate electrode has a magnitude such that it is significantly larger than the threshold voltage and forms an inversion layer in the gate region. As indicated by pulse 32, a voltage is then applied to the drain electrode 24 which voltage is less than the avalanching voltage which will cause channel current to flow. Under these conditions, electrons are generated which are caused to lodge in the gate dielectric and be retained therein. The magnitude of the gate and drain voltages is governed by the geometry of the device and the doping levels of the source and drain and background doping.

Figure 4:
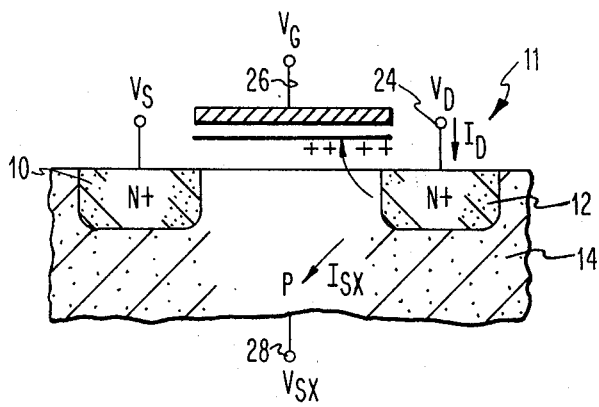
FIG. 4 is an elevational view of the memory cell of the invention illustrating the phenomenon occurring during the erase operation.
Figure 5:
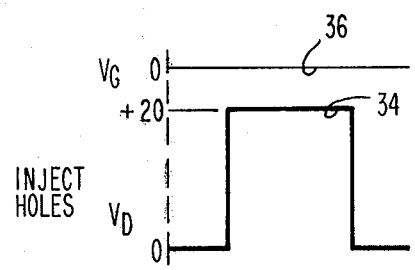
FIG. 5 is a pulse diagram for the erase operation of the memory cell of the invention.

In FIGS. 4 and 5 are illustrated the phenomena for erasing information in the device cell 11. Removing the charge in the gate dielectric is achieved by injecting the opposite type charge thereby neutralizing the first initial charge. This is accomplished by applying a voltage to the drain electrode 24 as indicated by pulse 34 in FIG. 5. The voltage applied to the drain electrode must equal or exceed the avalanche voltage and thereby cause avalanching. When the gate voltage is maintained at zero as indicated by line 36, holes are injected into the gate dielectric layer and the electrons are neutralized.

Figure 2:
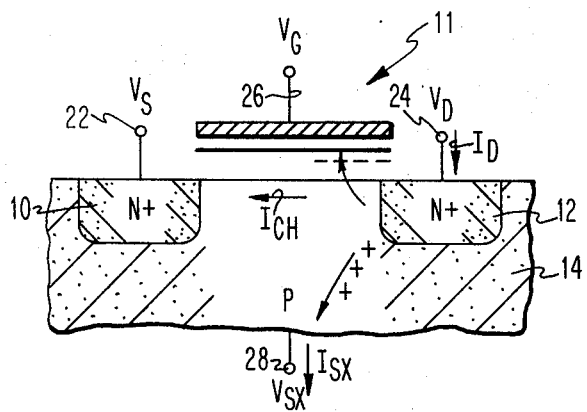
FIG. 2 is an elevational view of a schematic representation of the memory cell of the invention illustrating the phenomenon occurring during a write operation.

If the conductivity type of the substrate and source and drain regions were opposite to that illustrated in FIGS. 1, 2 and 4, the voltages applied must be of the opposite polarity. In this instance, holes would initially be injected into the gate dielectric layer and retained therein to indicate information. The holes would be neutralized by injection of electrons during the avalanching or erasing operation illustrated in FIGS. 4 and 5.

Figure 6:
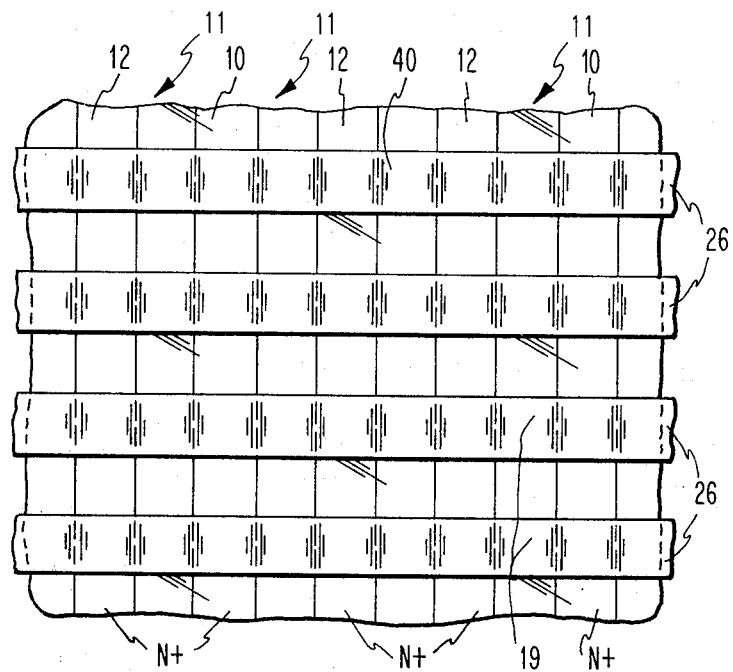
FIG. 6 is a top plan view of a memory array of the invention.
Figure 7:
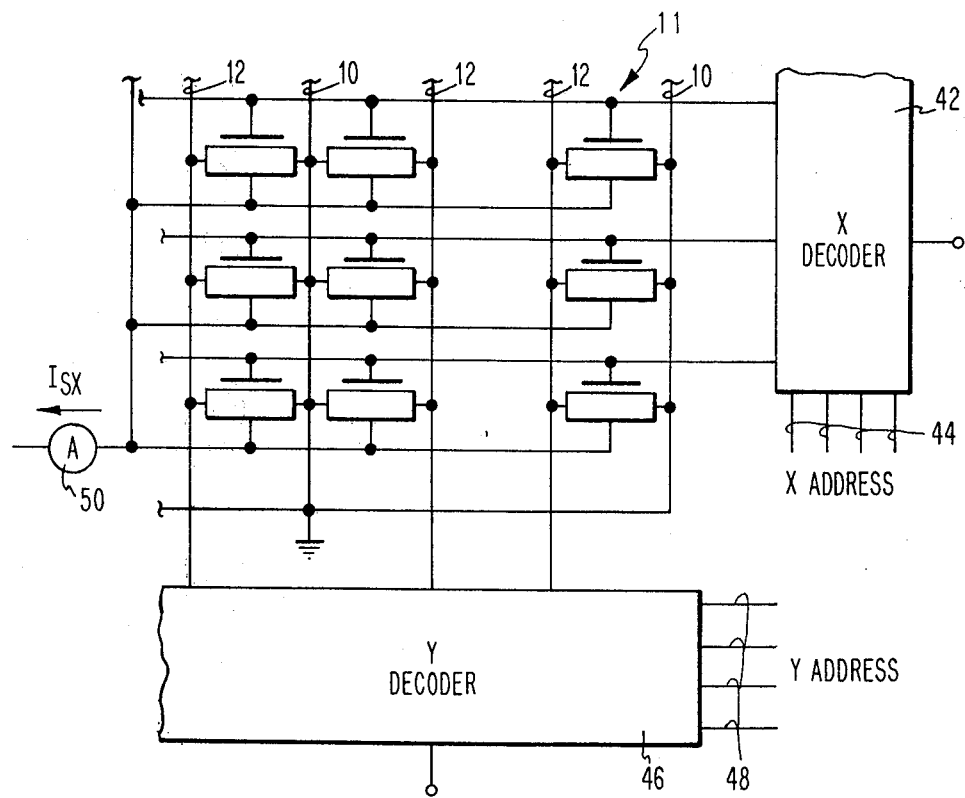
FIG. 7 is a schematic circuit representation of the memory array of the invention.

FIG. 6 illustrates how a typical array of cells of the type illustrated in FIG. 1 could be arranged in a semiconductor memory array. The source and drain regions 10 and 12 are elongated surface diffused regions and the gate 26 is formed of a transverse aluminum metallurgy stripe that is positioned relatively close to the channel region 19 and spaced a greater distance from the body 14 in the other regions. As indicated in FIG. 6, two rows of cells can utilize the same elongated diffused region 10 as a common source. Between two rows of cells there is provided a space 40 where the metallurgy stripe 26 is spaced a greater distance from the substrate 14 by the field dielectric layer 16. The resultant schematic representation of the cell array is illustrated in FIG. 7 of the drawings. Each row of gate electrodes is connected to an X decoder 42 that is adapted to apply either a zero, a +3 or a +15 voltage to the gate electrodes. The X decoder 42 is operated by inputs 44. The source regions 10 are shown grounded and the drain regions 12 connected to a Y decoder 46. Y decoder 46 has the capability of applying either a 15 or 20 volt pulse to any of the drain regions in the array. The decoder 46 is operated by inputs 48. The substrate current is measured by an ammeter element 50.

Figure 8:
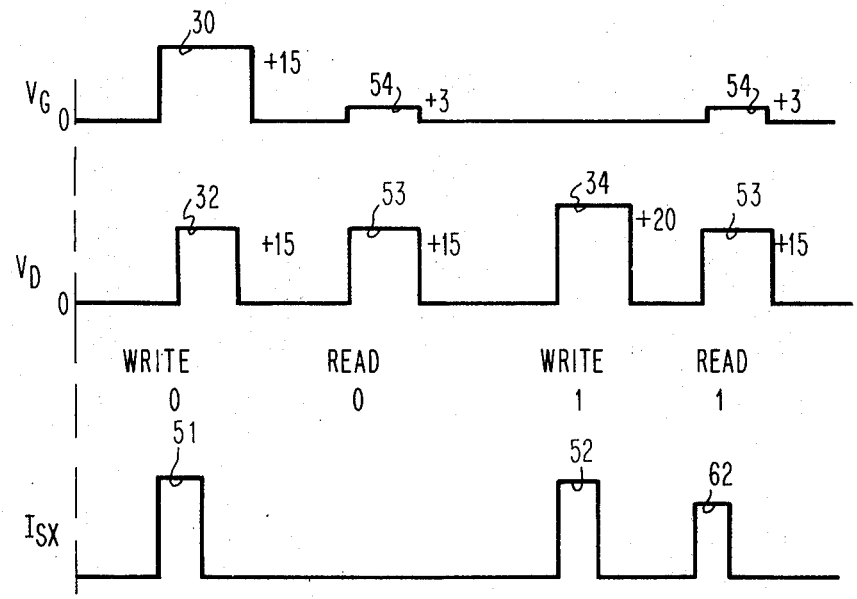
FIG. 8 is a pulse diagram for the write, erase and read operations of the memory cell of the invention.
Figure 9:
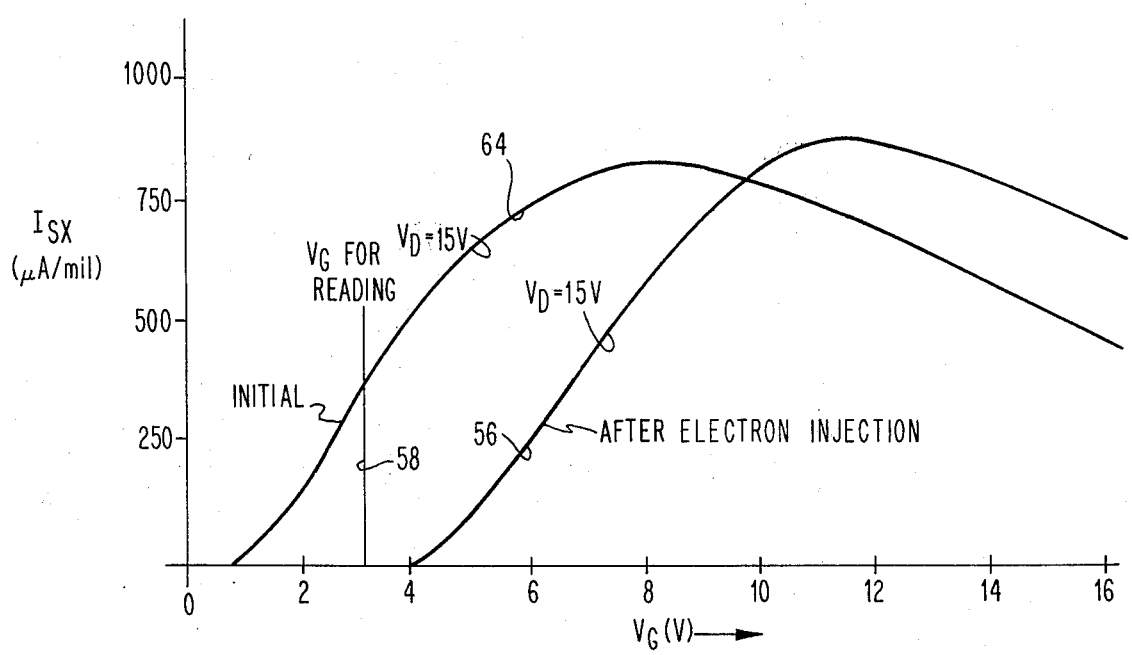
FIG. 9 is a graph of substrate current versus gate voltage illustrating the difference in operation of a charged and uncharged gate dielectric layer.

The mode of operation of the memory cell of the invention is illustrated in FIG. 8. In order to write a zero which is arbitrarily chosen to exist when electrons are injected into a dielectric layer, a pulse 30 is applied to the gate simultaneously with a pulse 32 to the drain. This results in a current pulse 51 in the substrate current. However, this pulse 51 is immaterial since it is not measured. To write a "1", a pulse 34 is applied to the drain by decoder 46 while the gate voltage is maintained by decoder 42 at zero. A current pulse 52 can be sensed by the element 50 but is not material since it is not measured during a write operation. In order to sense the condition of the cell, i.e. whether there is a "0" or a "1" stored therein, a voltage pulse 53 less than the voltage necessary to cause avalanching is applied by decoder 46 to the drain as indicated in FIG. 8 and a pulse 54 applied by decoder 42 to the gate. The appropriate value of the pulse 54 is indicated in FIG. 9. When there are electrons in the gate dielectric, no current will flow between the drain and the substrate as indicated in FIG. 8. This lack of substrate current is sensed by element 50. The reason for this condition is illustrated more clearly in FIG. 9 where curve 56 depicts the gate voltage for substrate current to flow at about 4 volts after stressing to introduce electrons in the gate dielectric. This is the condition represented by the writing of a zero. When a three volt pulse is applied to the gate electrode, as indicated by line 58, no current will flow. Conversely in reading a device in which a "1" has been stored, i.e. the absence of electrons in the gate dielectric, a pulse 53 is applied to the drain while simultaneously the pulse 54 is applied to the gate. Under these conditions, a current pulse 62 is sensed by element 50 in the substrate current. FIG. 9 indicates that a substrate current will flow since curve 64 which represents the erase condition indicates that a gate voltage of less than 3 volts will cause substrate current to flow.

Substrate current flows only when avalanche multiplication occurs at the drain end of the channel. The amount of avalanche multiplication depends on the electric field distribution in the channel. The charge trapped in the gate insulator modifies the electric field distribution at the drain end of the channel and consequently changes the relationship between the substrate current and applied gate and drain voltages. This effect is shown in FIG. 9.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A non-volatile read mostly memory cell comprising:
  a monocrystalline semiconductor substrate embodying a first type background impurity;
  spaced source and drain regions of a second opposite type impurity in said substrate defining a channel region therebetween;
  a gate dielectric layer capable of trapping a charge overlying said channel region;
  a gate electrode overlying said channel region between said source and drain regions;
  a substrate contact electrode;
  writing means to induce a trapped charge into said dielectric gate layer including:
  means to apply a voltage significantly larger than the threshold voltage to said gate electrode to form an inversion layer in said channel region; and
  means to apply a voltage less than the avalanching voltage to reverse bias said drain region causing channel current to flow thereby causing charge injection into said gate dielectric layer;
  erasing means to remove the trapped charge from said dielectric gate layer including:
  means to apply a voltage equal to or exceeding the avalanche voltage to said drain region to cause avalanching;
  reading means to determine the presence or absence of a charge in said gate dielectric including means to apply a voltage to reverse bias said drain region that is significantly less than the avalanche voltage, and means to monitor the substrate current;
  means to apply a voltage to the gate electrode that is slightly in excess of the threshold voltage; and
  means to monitor the substrate current.

2. The memory cell of claim 1 wherein said first type impurity is a P-type impurity and said second type impurity is an N-type impurity.

3. A memory cell of claim 1 wherein said gate dielectric layer is formed of a composite layer of $SiO_2$ with an overlying layer of $Si_3N_4$.

4. The memory cell of claim 3 wherein the thickness of each of the $SiO_2$ layer and the $Si_3N_4$ layer is in the range of 100 to 1000 Angstroms.

5. The memory cell of claim 1 wherein said gate dielectric layer is a composite layer formed of a lower layer of $SiO_2$ and an overlying layer of $Al_2O_3$.

6. The memory cell of claim 5 wherein the thickness of each of the $SiO_2$ layer and the $Al_2O_3$ layer is in the range of 100 to 1000 Angstroms.

7. The memory cell of claim 1 wherein said gate dielectric layer is a composite layer formed of a lower layer of $SiO_2$ and an overlying layer of silicon oxynitride.

8. The memory cell of claim 7 wherein the thickness of each of the $SiO_2$ layer and the silicon oxynitride is in the range of 100 to 1000 Angstroms.

9. A non-volatile memory array comprising:
  a monocrystalline semiconductor substrate embodying a first type impurity, cells arranged in rows and columns, each of said cells having spaced source and drain regions of a second type impurity that define a channel region therebetween;
  a gate dielectric layer capable of trapping a charge overlying said channel region of each cell;
  a gate electrode overlying said channel region between said source and drain regions;
  a substrate contact electrode;
  writing means to induce a trapped charge into said dielectric gate layer including:
  means to apply a voltage significantly larger than the threshold voltage to said gate electrode to form an inversion layer in said channel region, and
  means to apply a voltage less than the avalanching voltage to reverse bias said drain region causing channel current to flow thereby causing charge injection into said gate dielectric layer;
  erasing means to remove the trapped charge from said dielectric gate layer including:
  means to apply a voltage equal to or exceeding the avalanche voltage to said drain region to cause avalanching;
  reading means to determine the presence or absence of a charge in said gate dielectric including means to apply a voltage to reverse bias said drain region that is significantly less than the avalanche voltage, and means to monitor the substrate current;
  means to apply a voltage to said gate electrode that is slightly in excess of the threshold voltage;
  said array including elongated parallel spaced diffused regions in the column direction that constitute said source and drain regions, and elongated parallel conductive metallurgy strips on the surface in the row direction that constitute said gate electrodes of said cell.

10. The memory array of claim 9 wherein said first type impurity is a P-type impurity and said second type impurity is N-type.

11. The memory array of claim 10 wherein said gate dielectric is a composite layer of an underlying layer of $SiO_2$ and an overlying layer of $Si_3N_4$.

12. The memory array of claim 11 wherein the thickness of each of said $SiO_2$ and $Si_3N_4$ layers is in the range of 100 to 1000 Angstroms.

* * * * *